United States Patent [19]

Sawada et al.

[11] Patent Number: 5,710,992
[45] Date of Patent: Jan. 20, 1998

[54] CHAIN SEARCH IN A SCANNING RECEIVER

[75] Inventors: Daisuke Sawada, Dallas; Paul E. Kearney, Tarrant, both of Tex.

[73] Assignee: Uniden America Corporation, Fort Worth, Tex.

[21] Appl. No.: 678,961

[22] Filed: Jul. 12, 1996

[51] Int. Cl.$^6$ .................................................. H04B 1/18
[52] U.S. Cl. ........................... 455/161.2; 455/165.1; 455/166.1; 455/168.1
[58] Field of Search ................. 455/161.2, 161.3, 455/164.2, 165.1, 166.1, 166.2, 168.1

[56] References Cited

U.S. PATENT DOCUMENTS

| | | | |
|---|---|---|---|
| 4,092,594 | 5/1978 | Baker | 455/165.1 X |
| 4,218,773 | 8/1980 | Imamura | 455/165.1 X |
| 4,236,251 | 11/1980 | Ohgishi et al. | 455/180.1 |
| 4,409,688 | 10/1983 | Baker | 455/165.1 |
| 4,461,036 | 7/1984 | Williamson et al. | 455/165.1 |
| 4,833,728 | 5/1989 | Kimura et al. | 455/166.2 |
| 5,355,527 | 10/1994 | Owaki | 455/186.2 |
| 5,483,684 | 1/1996 | Ono et al. | 455/161.2 |

*Primary Examiner*—Thomas Mullen
*Attorney, Agent, or Firm*—Daniel R. Brown

[57] ABSTRACT

A method of searching for active signal frequencies from a plurality of frequency bands is disclosed. Bands of frequencies are defined by upper and lower limit frequencies. The bands are stored as chains in a chain memory. A controller searches for active signal frequencies by sequentially recalling each chain and searching the band of frequencies defined by the upper and lower limit frequencies. Active signal frequencies may be stored in a channel memory.

1 Claim, 5 Drawing Sheets

| CHAIN | LIMIT | FREQ. | ENABLE |
|---|---|---|---|
| 1 | UPPER | 29.700 | Y |
| 1 | LOWER | 29.000 | Y |
| 2 | UPPER | 54.000 | Y |
| 2 | LOWER | 50.000 | Y |
| 3 | UPPER | 148.000 | N |
| 3 | LOWER | 144.000 | N |
| 4 | UPPER | 420.000 | N |
| 4 | LOWER | 450.000 | N |
| 5 | UPPER | 512.000 | Y |
| 5 | LOWER | 470.000 | Y |

FIG. 2

CHAIN SEARCH IN A SCANNING RECEIVER

TECHNICAL FIELD OF THE INVENTION

This invention relates to frequency scanning radio receivers and more particularly to scanning radio receivers having chain search capability.

BACKGROUND OF THE INVENTION

Scanning radio receivers are well known in the art and have improved and evolved with the ever higher level of circuit integration available in modern electronic technology.

It is common for a modern scanning radio (scanner) to comprise a microcontroller or microprocessor with memory. Scanners typically utilize a phase-lock-loop frequency synthesizer so that a great number of frequencies can be received, and if desired, stored in a channel memory for later recollection. It is common for a scanner to comprise hundreds of storage locations in its channel memory. It is also common for modern scanning receivers to receive a very wide bandwidth of frequencies. Receivers are capable of receiving from 29 MHz to over 1 GHz in channel increments of 5 kHz, 12.5 kHz, and 25 kHz, for example.

A common operational mode for such a scanning receiver is to scan a desired band of frequencies and listen for desired signal transmissions. Upon hearing such a signal, the user can manually program the received frequency into a channel memory, so that the frequency can be subsequently scanned for reception signal transmissions. A plurality of frequencies may carry related signal transmission and therefore it is desirable to scan a group of frequencies, or channels, in order to receive all of the related signals. For example, the aircraft band comprises the frequencies ranging approximately from 108 MHz to 137 MHz. Various frequencies in this band may or may not carry signals depending of the geographic location and air traffic in that area. Because of this grouping of frequencies, modern scanning receivers have channel memories which group a plurality of channel memory storage locations into banks of storage locations, or channels, which can be selectively scanned. For example, a first bank may be programmed with frequencies in the aircraft band. A second bank may be programmed with frequencies from the 70 cm amateur radio band, etc. When a user desires to scan a particular group of channels known to carry intermittent signal transmissions, the user merely activates a bank of channel memories which had been previously programmed with the desired group of frequencies.

The task of programming the various frequencies which regularly carry intermittent signals into a channel memory can be difficult and time consuming. Considering, in the foregoing example, that the band of frequencies from 108 MHz to 137 MHz is divided into approximately 2300 discrete frequencies.

To alleviate and simplify this problem, certain publications are available which tabulate the frequencies for various types of services in particular geographic areas. Scanner users can refer to this type of publication to select frequencies and program channels into a scanning receiver, so that the desired channels can be scanned to monitor the desired communications signals. However, the use of such a publication is not an ideal solution nor a particularly convenient method of programing channels into a scanning receiver. Frequently, there are a large number of channels listed for a particular service type and many of these channels are essentially idle. If a user programs all of the channels for a particular service type into the scanning receiver, then many of the scanner channel memory storage locations will be filled with channels that have very little chance of carrying desirable signals. Furthermore, when the scanner is scanning the plurality of programmed channels, time will be wasted scanning the aforementioned idle channels. As such, desired communications signals will not be received during the time the idle channels are scanned. Also, the Federal Communications Commission continually licenses new users in the various bands so that no publication listing frequency allocations can be completely up to date.

Other communications receivers have been devised which scan for the presence of a signal and so note the presence of such signals. Modern television sets, for example, have automatic channel search features which scan all the channels which are receivable by the receiver and record the existence of signals on each of the channels on which they are found. However, such a scheme relies on the fact that a continuous signal is being broadcast at a particular frequency, allowing the automatic channel search feature to find the signal at the moment it receives a particular frequency. In the situation of a broad band scanning receiver, however, most of the transmitted signals are not continuous, but rather intermittent. Therefore, the channel search features as described above will not be suitable.

U.S. Pat. No. 5,483,684 to Ono et al. for AUTOMATIC FREQUENCY SEARCH AND STORAGE METHOD describes a method for searching a specific band of frequencies for active signal frequencies. This simplifies the process of identifying active signal frequencies within a single band of frequencies in an automated fashion. First and second limit frequencies are specified and a controller in the scanner searches the range of frequencies defined by the limit frequencies. As active signal frequencies are identified, they can be stored in a channel memory.

The allocation frequencies by the Federal Communications Commission is not continuous. Between bands of frequencies which are of interest to users of scanners are other bands which are not of interest. For example, television and FM broadcast stations are normally not of interest to scanner users. Furthermore, individual users have interest in certain narrow bands of frequencies and not others. For example, HAM radio users may only be interested in the several narrow amateur bands. As such, a scanner user typically can not specify a first and second limit frequency to define a search for all the frequencies of interest to that particular user.

There is a need to simplify the process of specifying a plurality of frequency bands in a scanner for the purpose of searching for active signal frequencies from within that plurality of bands of frequencies, that carry intermittently transmitted signals.

SUMMARY OF THE INVENTION

The preferred embodiment of the present invention is a scanning radio receiver with a chain search capability. A conventional scanner has a chain memory which stores a plurality of chains. Each chain includes an upper and lower limit frequency and an enable bit. Each chain is further identified by a chain number.

The user of the scanner can enter a desired upper and lower limit frequency for each of a plurality of chains that define a frequency band for each chain. The user can change the limit frequencies from time to time.

In an automatic chain search mode of operation, the scanner controller sequentially searches the bands of frequencies defined for each enabled chain. When active signal frequencies are found, the scanner stops and receives the signals. A frequency identifier associated with each active signal frequency may be stored in a channel memory for later recollection and reception.

BRIEF DESCRIPTION OF THE DRAWINGS

The features of the present invention which are believed to be novel are set forth with particularity in the appended claims. The invention, together with further objects and advantages thereof, may be best understood by making reference to the following description taken in conjunction with the accompanying drawings, in the several figures of which like reference numerals identify identical elements, and wherein:

FIG. 2 is a memory map of the chain memory in the preferred embodiment.

DETAILED DESCRIPTION

The present invention is embodied in a broad band scanning receiver. The various steps claimed are executed either by object code software commands, under control of a microcontroller, described later, or by user input commands to the scanning receiver.

Figure 1:
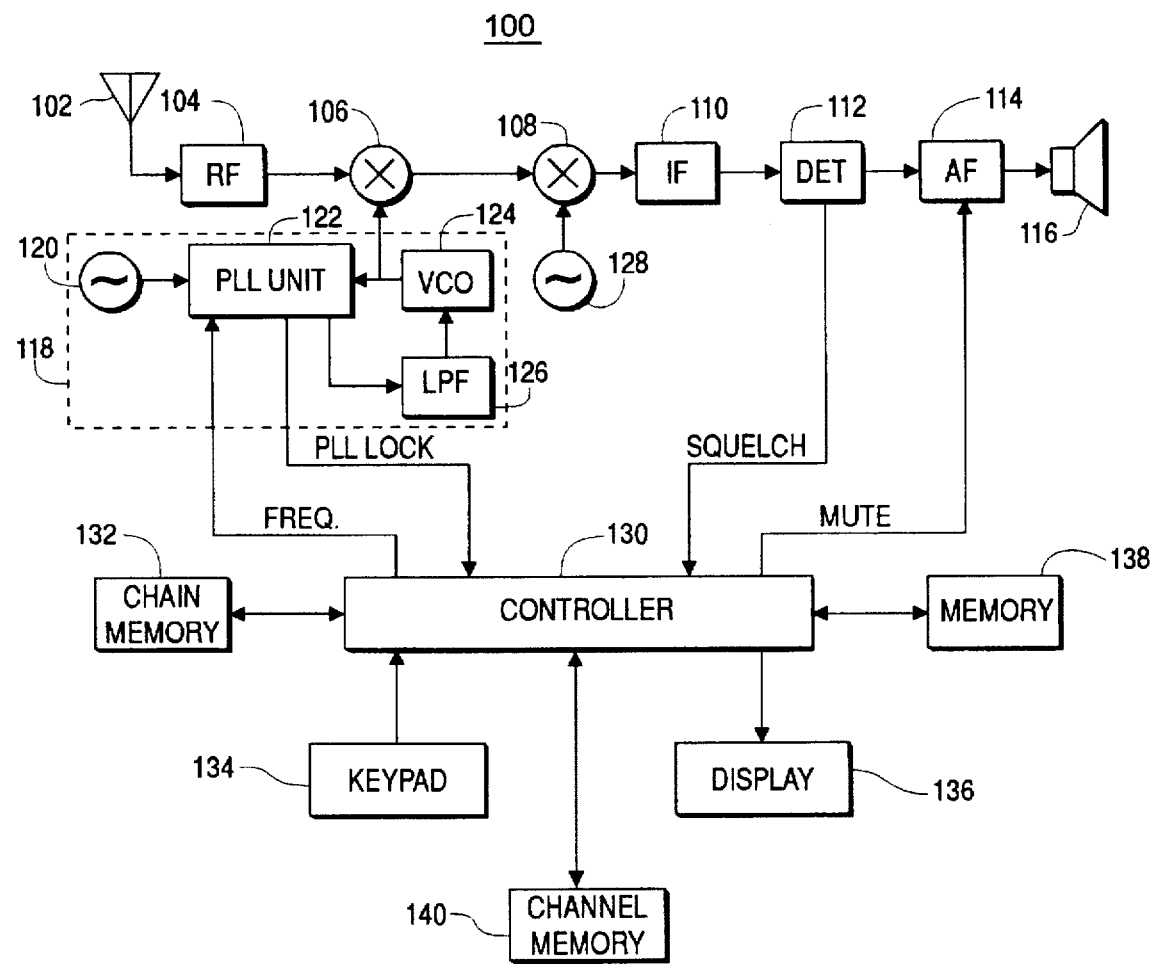
FIG. 1 is an electrical block diagram of a scanning receiver in the preferred embodiment.

Reference is directed to FIG. 1 which is an electrical block diagram of the scanning receiver, or scanner, in the preferred embodiment. The scanner comprises an RF circuit 104 which receives a broad band of RF waves comprising a plurality of RF signals, from time to time, as received by antenna 102. The output of RF circuit 104 is coupled to a first mixer 106. First mixer 106 mixes the signals output from RF circuit 104 with signals coupled from the output of a frequency synthesizer circuit 118 comprising a PLL unit 122, voltage controlled oscillator 124, low pass filter 126, and first oscillator 120. Together these components form a phase lock loop frequency synthesizer 118.

The PLL unit 122 comprises a phase comparator circuits (not shown), and a divide by counter (not shown). A FREQ. signal is input to the divide by counter from controller 130, and this signal provides a number which is a divisor for the divide by counter. Varying the quantity of this number causes the PLL unit 122 to vary the signal into the low pass filter 126 which in turn controls the input voltage to the voltage controlled oscillator 124. As such, entering a number into the PLL unit 122 determines the frequency of the signal coupled to mixer 106, and thereby controls the frequency of reception of the entire receiver. At the instant a new number is output from controller 130 to PLL unit 122, the phase comparator indicates out of phase condition, or out of lock condition to controller 130 via the PLL LOCK signal. The frequency synthesizer 118, as a unit, slows the VCO 124 to the correct frequency after a brief period of time. As this occurs, the phase comparator indicates a lock up condition to the controller 130 via the PLL LOCK signal.

The output of frequency synthesizer 118 mixes with the output of RF circuit 104 in first mixer 106 to produce a first intermediate frequency at the output of mixer 106. The first intermediate frequency is coupled to the input of second mixer 108. A second local oscillator 128 feeds a second local oscillator frequency into mixer 108 and the first intermediate frequency and second oscillator frequency mix in mixer 108 to produce a second intermediate frequency which is coupled to the input of intermediate frequency circuit 110. The output of intermediate frequency circuit 110 is coupled to the input of detector circuit 112 which produces an audio frequency output that is further coupled to audio frequency circuit 114. Detector circuit 112 also produces a squelch output signal which indicates the presence of an active signal, SQUELCH, to controller 130. Squelch signals are commonly used in radio for various types of receivers including amplitude modulated signal receivers and frequency modulated signal receivers. It is common for the threshold level of the squelch signal to be adjustable by means of a potentiometer, or other similar control. Adjustment of the squelch threshold adjusts the threshold signal strength of an active signal frequency that will be received and stored in the preferred embodiment. It is understood that other techniques could be used as means for determining whether or not an active signal is acceptable or not.

Audio frequency circuit 114 amplifies the aforementioned audio signal and drives speaker 116. Audio frequency circuit 114 also receives a muting signal, MUTE, from controller 130 which enables and disables the output of audio circuit 114, thereby enabling and disabling the audio signal reproduced by speaker 116.

Controller 130 may comprise an 8-bit central processing unit together with memory, including RAM, ROM, and EEPROM, and peripheral input/output circuitry. Such devices are well known to those skilled in the art. In FIG. 1, a separate chain memory 132 is shown, however, the chain memory may be a part of the aforementioned memory circuits comprised within the controller 130. In the preferred embodiment, EEPROM is used because of its non-volatile attribute. Chain memory 132 is shown as a separate entity in FIG. 1 for clarity only. The preferred embodiment also comprises a memory 138 which stores object code that partially embodies the claimed invention. ROM memory 138 is utilized. A channel memory 140 is coupled to controller 130 and is used to store frequency identifiers, correlated to channel numbers.

A keypad 134 is coupled to the controller 130 in the preferred embodiment. The keypad serves as an input device for selecting the upper and lower limit frequencies of the search chain, bands and for enabling the automatic chain search method described herein. The keypad is of conventional design and includes the numeric digits "0" through "9" and a decimal point. Frequencies are entered as multiples of one megahertz. For example 153.500 MHz is entered as "1-5-3-.-5-0-0". The keypad also includes actuators for specifying the limit frequencies, and, an actuator for enabling and disabling the automatic chain search method. Frequencies are converted by controller 130 into frequency identification numbers which are used as divisors for the PLL unit 122, as described herein before. The keypad 134 is also used to enable chains within the chain memory 132. In the preferred embodiment, there is memory capacity for five chains in the chain memory; the chains are identified by the numbers "1" through "5".

A display 136 is coupled to controller 130 for displaying various status information concerning the operation of the scanning receiver. In the preferred embodiment, the display is a custom masked liquid crystal type which comprises seven digits of seven-segment display characters plus a decimal point for displaying the frequency information, two additional digits of seven-segment display characters for displaying channel numbers. Also, the display comprises icons for the numbers "1" through "5" for displaying the selection of the active search chain bands.

Reference is directed to FIG. 2 which is a memory map of the chain memory 132 in the preferred embodiment. The chain memory comprises a plurality of storage locations which are subdivided into chains. Each chain is identified by a chain identifier, such as "1" 232, "2" 234, "3" 236, "4" 238, and "5" 240. In the preferred embodiment, each chain comprises two storage locations for storing an upper and lower limit frequency for the given chain. In addition, each chain has an enable flag associated therewith. Specifically, chain "1" comprises upper limit frequency storage location 202, lower limit frequency storage location 204, and enable flag 222. Chain "2" comprises upper limit frequency storage location 206, lower limit frequency storage location 208, and enable flag 224. Chain "3" comprises upper limit frequency storage location 210, lower limit frequency storage location 212, and enable flag 226. Chain "4" comprises upper limit frequency storage location 214, lower limit frequency storage location 216, and enable flag 228. Finally, chain "5" comprises upper limit frequency storage location 218, lower limit frequency storage location 220, and enable flag 230.

The chains are selectable from the keypad 134 by repeatedly depressing a "SLCT" key. A pointer 242 is stored in memory for identifying the currently selected chain to the software processes executed by the controller 130.

Figure 3A:
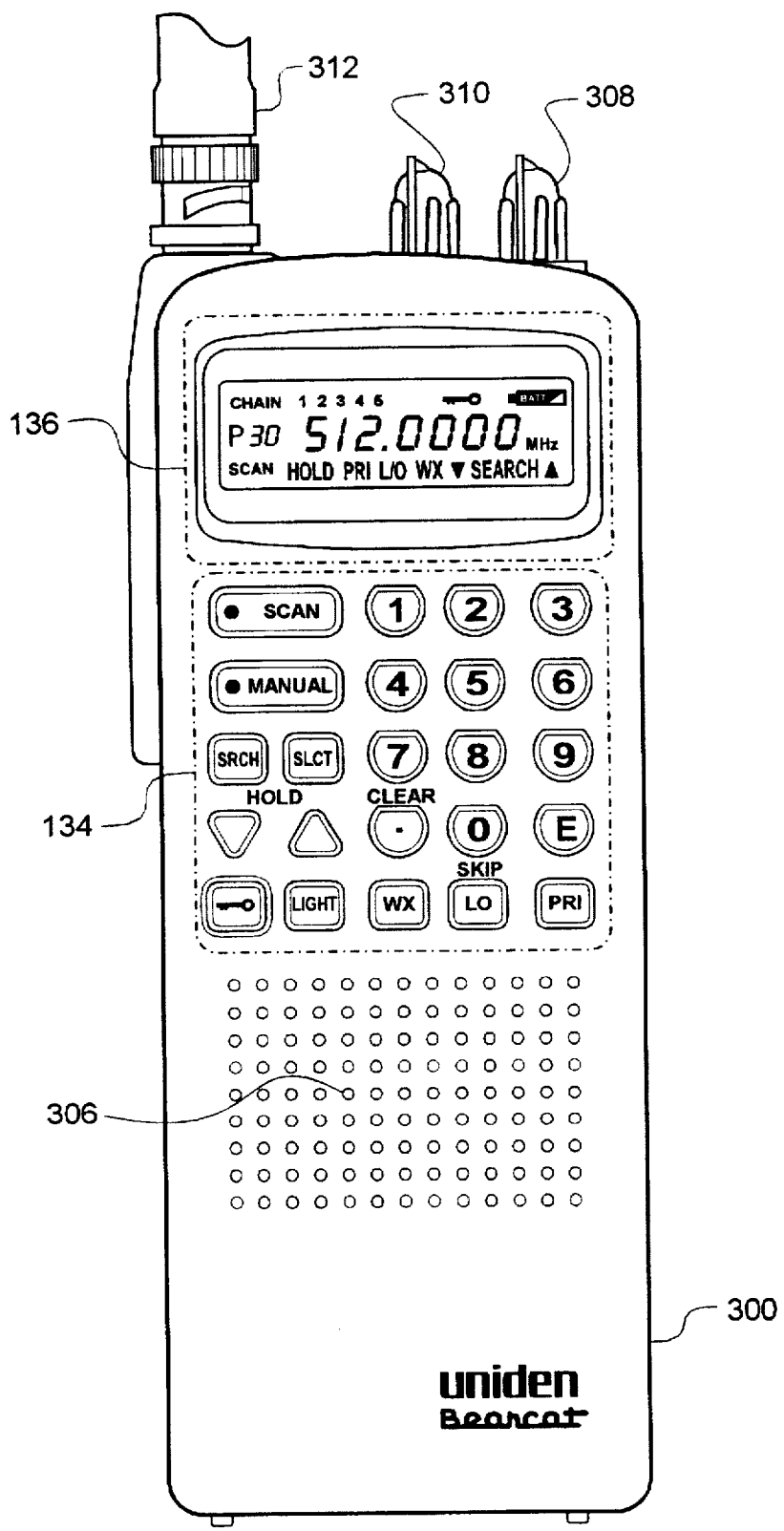
FIG. 3A, 3B, and 3C are details of the preferred embodiment scanning receiver, including the display (3B) and keypad (3C).
Figure 3B:
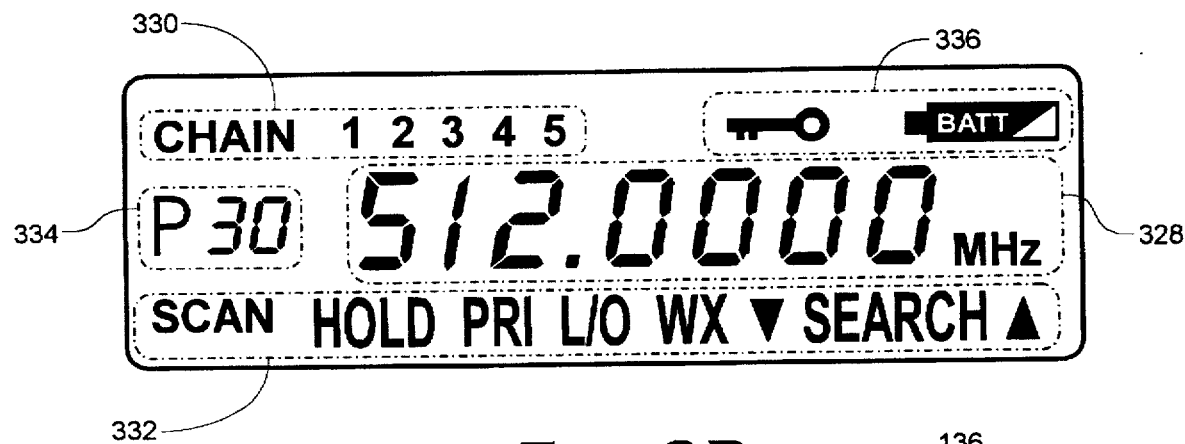
Figure 3C:
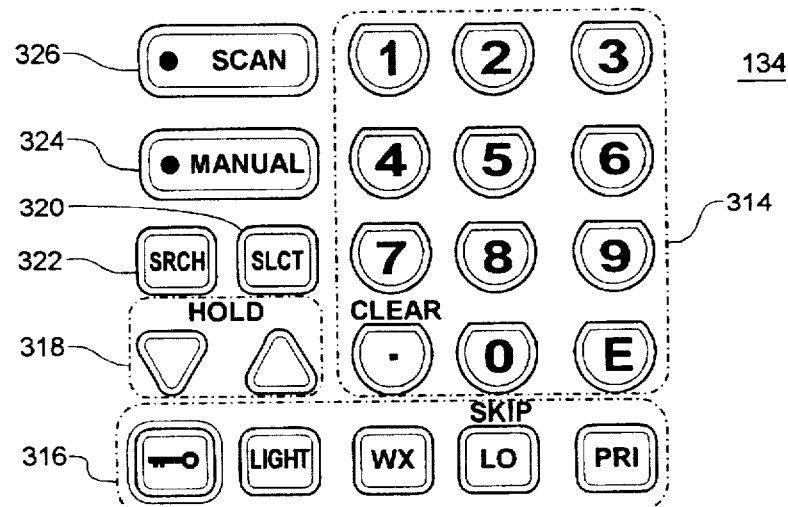

Reference is directed to FIGS. 3A, 3B, and 3C, which are details of the scanning receiver in the preferred embodiment. FIG. 3A depicts and overall frontal view of the scanner 300. The display 136 is further detailed in FIG. 3B. The keypad 134 is further detailed in FIG. 3C.

The scanner 300 includes an antenna connector and antenna 312, a squelch potentiometer knob 310, a volume control knob 308, the display 136, the keypad 134, and a speaker grill 306, behind which is the speaker 116 (not shown).

Reference is directed to FIG. 3B which is a detail of the display 136. In the preferred embodiment, a custom masked liquid crystal display is used. The display is driven by the controller 130 (not shown). The display comprises a seven digit, seven-segment display portion 328 which displays the frequency of operation of the receiver. This portion also include a "MHz" icon. The display includes an icon portion 332 which comprises "SCAN", "HOLD", "PRI", "L/O", "WX", "⇑", "SEARCH", and "⇓" icons. These icons are used to display the status of operation of the scanner for various functions. An additional icon portion 336 is included which has lock and low battery icons.

The display 136 includes a channel portion 334 which includes two seven-segment digit displays for displaying the channel of operation. A channel is a number assigned to a storage location in the channel memory which stores a correlated frequency identifier. Users can store a frequency of operation in a channel and later recall the channel number to cause the controller to tune the scanner to the frequency associated with the selected channel. The channel portion 334 also includes the letter "P" for indicating that a particular channel is a priority scan channel.

The display includes a chain search portion 330 which is used in the present invention to assist in controlling the operation of the chain search feature. The chain search portion includes the word "CHAIN" and the numbers "1", "2", "3", "4", and "5". The numbers correspond to each of the five chains in the chain memory and are used to identify which chain frequency band is selected, selectable, or active, depending on the mode of operation of the scanner.

Reference is directed to FIG. 3C, which is a detail of the keypad 134 in the preferred embodiment of the present invention. The keypad is a membrane type which is coupled to the controller 130 for inputting key closures thereto. The controller 130 responds to key closures in accordance with the object code software during execution of same.

The keypad 134 includes a numeric entry portion 314 which further includes the number "0" through "9", a decimal point, and the letter "E". The "E" functions as an enter key when inputting frequency and channel information into the scanner. The keypad 134 includes a special function portion 316 for controlling the keyboard lock, display illumination, weather frequency reception, channel lock-out, and channel priority functions of the scanner. The keypad 134 includes scan and search direction keys "⇑" and "⇓" 318. These keys are actuated by the user to control the direction, either upwardly or downwardly in frequency or channels, that the scanner increments frequencies or channels in the scanning and searching modes of operation. The keypad 134 includes a search key "SRCH" 322 and a select key "SLCT" 320. These keys are used in the present invention to select the frequency ranges of the search chain bands and to enable and disable the chain search function. In addition, the select key is used to enable and disable particular chains during the chain search operation. The keypad 134 includes a "SCAN" key 326 and a "MANUAL" key 324 which are used to control the scan and manual modes of operation of the scanner.

Figure 4:
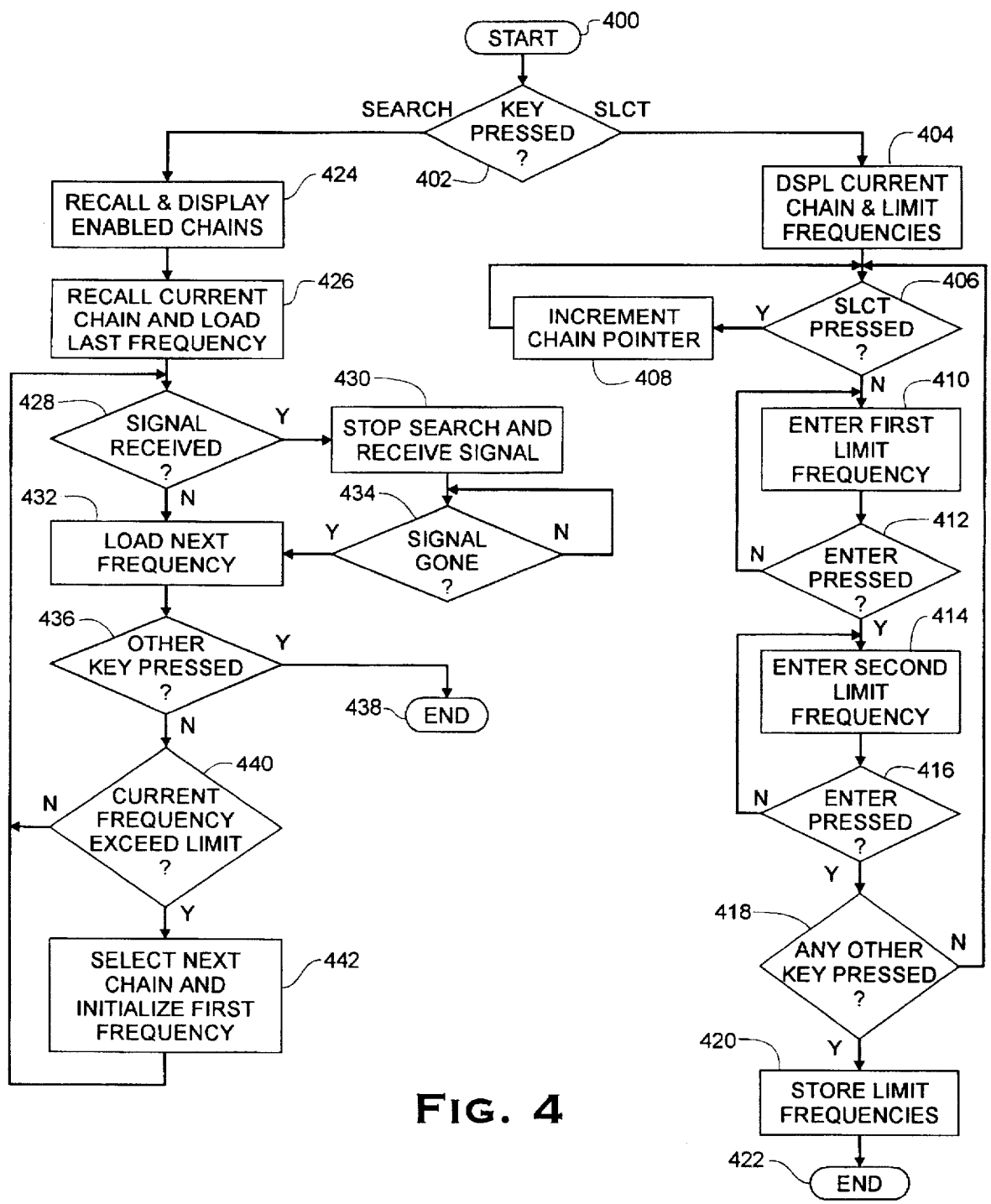
FIG. 4 is a flow diagram of the preferred embodiment.

Reference is directed to FIG. 4 which is a software flow diagram of the preferred embodiment of the present invention. The flow diagram begins at step 400 with the scanner in a standby, or other, mode of operation. A decision must be made at step 402 as to which of two general modes of operation in the preferred embodiment are to be executed. By pressing the search "SRCH" or select "SLCT" keys, the user chooses either of these two modes of operation at step 402. It is to be understood that other keys might be pressed on the keyboard of the scanner to invoke other modes of operation, however, for the present invention, either of the "SRCH" or SLCT" keys is to be actuated.

If the "SLCT" key is pressed at step 402, the controller proceeds to the chain band selection mode of operation at step 404 where the controller recalls a current chain pointer and the limit frequencies associated with the chain pointed to by the pointer. The chain number identifying the current chain is displayed and the frequency of the upper and lower frequency limits, for that chain, are alternately displayed. This enables the user to review the current chain and the limited frequencies associated therewith.

If the user wishes to review a different chain, the user can press "SLCT" again at step 406. On each actuation of the "SLCT" key, the controller increments the current chain pointer at step 408. If the "SLCT" key is repeatedly pressed, the user can scroll the current chain pointer through all five chains and repeat the process again and again. Once the user has selected the desired chain, the limit frequencies can be entered or altered by the user.

At step 410, the user keys in a new first limit frequency. For example, the user might key in "2-9" or "1-3-8-.-6-2-5" which would be interpreted as 29.000 MHz and 138.6250 MHz respectively. When the user has keyed in the desired frequency, the "E" enter key is pressed at step 412. Next, the user keys in the second limit frequency at step 414 in a similar fashion to the first limit frequency. The user presses enter at step 416 to complete the limit frequency entry process.

At step 418, the user may make a decision to press another key other than the "SLCT" key, which terminates the entry process. Then, the flow recirculates to step 406. By pressing the "SLCT" key again at step 406, the user increments the current chain and is ready to enter new limit frequencies for the next selected chain. By recirculating through steps 406 through 418, the user can program any or all of the chain limit frequencies.

At step 418, if a key other than "SLCT" is pressed, the chain limit frequency entry process is completed and the limit frequencies are stored in the chain memory at step 420. The controller compares the first and second limit frequencies for each chain that was altered and stores them as upper and lower limit frequencies in the chain memory depending on the numerical value of the frequencies. That is, the numerically higher frequency is stored as the upper limit frequency and the lower frequency is stored as the numerically lower limit frequency for each chain. This ordering process allows the user to enter the first and second limit frequencies without concern as to whether they are entered in any particular order.

Upon completion of the storing step, 420, the chain selection process is complete at step 422 and the scanner returns to its stand-by or other previous mode of operation.

Having entered the chain limit frequencies, the scanner is properly prepared to begin chain search operation. This mode is activated by pressing the "SRCH" search key at step 402. When the chain search mode is activated, the controller recalls the enable bit for each chain and displays the chain number for each chain that is currently enabled, at step 424. This display function informs the user as to which chains will be searched. If the user wants to eliminate any of the currently enabled chains, or, if the user wants to enable chains that are currently disabled, the user merely needs to touch the keypad number corresponding to the chain of interest to toggle the enable bit between enabled and disabled. The display will automatically be updated accordingly, and the chains will be enabled or disabled accordingly.

Returning to the flow diagram at step 424, the controller proceeds to step 426 where is recalled the current chain pointer 242 and the last operating frequency from a last frequency storage location (not shown). The last frequency is loaded into the synthesizer and the scanner checks to determine if a signal is being received at step 428. As was discussed earlier, the presence of a signal is determined by the state of the squelch signal.

If a signal is received at step 428, the controller stops the search and receives the signal at step 430. It is at this time that the user can store the signal into the channel memory by pressing the enter key. Alternatively, the controller may automatically store a frequency identifier associated with the current frequency into a predetermined channel memory storage location. Upon receipt of a signal, the controller will continue receiving the signal at step 434 until the signal goes away, at which time the controller 130 will proceed to step 432 without receiving a signal. Similarly, if no signal is received at step 428, the controller proceeds to step 432. At step 432, the controller loads the next incremental frequency into the PLL unit. The next incremental frequency is determined by a frequency step reference variable whose value is dependent on the frequency being searched and is preprogrammed into the scanner at the time of manufacture. Such step may be 5 kHz, 12.5 kHz, or 25 kHz, for example.

Next, the controller checks to determine if another key has been pressed at step 436. If a key has been pressed, the chain search routine is ended at step 438 when the scanner returns to a standby mode, or other modes, of operation. However, if no key has been pressed, the controller proceeds to step 440 to test if the new current frequency, which was incremented to at step 432, exceeds the limit frequency at step 440. If the controller has been set to increment the frequency at each step, then the upper limit frequency for the current chain is used as the reference at step 440. Conversely, if the controller is decrementing the frequency at each step, the lower limit frequency for the current chain is used as the reference at step 440.

In either case, if the limit frequency is exceeded, then the controller selects the next enabled chain from the chain memory at step 442. The first limit frequency from the next chain is initialized and the search continues by recirculating to step 428. If only one chain band was enabled, then the controller would reinitialize the first limit frequency for that chain. Returning to step 440, if the current frequency did not exceed the limit, then the controller would recirculate to step 428 and continue the searching process without selecting the next enabled chain.

It is to be understood that the direction of the search, either upwardly or downwardly in frequency, determines whether the upper limit frequency or the lower limit frequency is used in the incremental change at step 432 and in the "exceed the limit" test at step 440.

The foregoing software flow diagram, as depicted in FIG. 4, represents the preferred embodiment. When a signal is received at step 428, and while the scanner remains stopped receiving the signal at step 434, the user may store the frequency in the channel memory. Similarly, it is understood that the scanner could automatically store the frequency into a preselected storage location in the channels memory. Such a technique is taught in U.S. Pat. No. 5,483,684 to Ono et al. for AUTOMATIC FREQUENCY SEARCH AND STORAGE METHOD.

While the foregoing specification and drawings enable those skilled in this and related arts to practice the present invention in accordance with the preferred embodiment, the claimed invention encompasses a broader scope. Further modifications and improvements may occur which will make obvious manifold variants of the present invention. The claims appended hereunto are intended to read upon all such variants.

What is claimed is:

1. A method of searching for active signal frequencies from within a plurality of bands of frequencies in a scanning receiver having a controller and a chain memory, the chain memory being suitable for storing a plurality of chains and each chain having an upper limit frequency storage location and a lower limit frequency storage location, and each chain having an enable bit storage location and each chain identified by a chain number, the method comprising the steps of:

specifying at least two of said plurality of chains;

specifying an upper and lower limit frequency for said at least two of said chains;

storing said upper and lower limit frequencies in the chain memory;

enabling at least two of the enable bits in the chain memory;

automatically scanning a plurality of frequencies within the bands of frequencies defined by said at least two of said plurality of chains in accordance with said upper and lower limit frequencies, and upon detecting a signal on one of said plurality of frequencies, receiving said signal.

* * * * *